(12) United States Patent
Matsuyama

(10) Patent No.: US 10,957,673 B2
(45) Date of Patent: Mar. 23, 2021

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Hiroshi Matsuyama, Hyogo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/849,410

(22) Filed: Apr. 15, 2020

(65) Prior Publication Data

US 2020/0243490 A1 Jul. 30, 2020

Related U.S. Application Data

(63) Continuation of application No. 16/269,815, filed on Feb. 7, 2019, now Pat. No. 10,658,344.

(30) Foreign Application Priority Data

Sep. 14, 2018 (JP) .............................. JP2018-173126

(51) Int. Cl.
*H01L 25/07* (2006.01)
*H01L 23/49* (2006.01)
(Continued)

(52) U.S. Cl.
CPC ...... *H01L 25/072* (2013.01); *H01L 23/49811* (2013.01); *H01L 23/49844* (2013.01); *H01L 23/5386* (2013.01)

(58) Field of Classification Search
CPC ............ H01L 25/072; H01L 23/49811; H01L 23/49844; H01L 23/5386
(Continued)

(56) References Cited

U.S. PATENT DOCUMENTS 8,129,836 B2 3/2012 Takano et al.
8,217,509 B2 * 7/2012 Horiuchi ............ H01L 23/5389
257/692

(Continued)

FOREIGN PATENT DOCUMENTS

JP 4977407 B2 7/2012
JP 5555206 B2 7/2014
JP 2016-035970 A 3/2016

*Primary Examiner* — Sheikh Maruf
(74) *Attorney, Agent, or Firm* — White & Case LLP

(57) ABSTRACT

A semiconductor device of an embodiment includes a metal layer; a semiconductor chip on the metal layer and having an upper electrode and a lower electrode; a first wiring board electrically connected to the upper electrode, and includes a first, a second, a third plate-shaped portion, the first plate-shaped portion being parallel to the second plate-shaped portion, and the third plate-shaped portion being connected to the first and the second plate-shaped portion; a second wiring board electrically connected to the metal layer, and includes a fifth, a sixth, and a seventh plate-shaped portion, the fifth plate-shaped portion being parallel to the sixth plate-shaped portion, and the seventh plate-shaped portion being connected to the fifth and the sixth plate-shaped portion. The first and the second plate-shaped portion are provided between the fifth and the sixth plate-shaped portion, and the semiconductor chip is positioned between the fifth and the sixth plate-shaped portion.

10 Claims, 14 Drawing Sheets

(51) Int. Cl.
 *H01L 23/498* (2006.01)
 *H01L 23/538* (2006.01)
(58) Field of Classification Search
 USPC .......................................... 438/117; 257/693
 See application file for complete search history.

(56) References Cited

U.S. PATENT DOCUMENTS

| | | | |
|---|---|---|---|
| 8,736,043 B2 | 5/2014 | Konno et al. | |
| 2003/0133274 A1* | 7/2003 | Chen | H01L 23/5389 |
| | | | 361/760 |
| 2004/0195686 A1* | 10/2004 | Jobetto | H01L 21/568 |
| | | | 257/734 |
| 2006/0113664 A1 | 6/2006 | Shiraishi et al. | |
| 2009/0008728 A1* | 1/2009 | Fujii | B81B 7/007 |
| | | | 257/415 |
| 2010/0148298 A1 | 6/2010 | Takano et al. | |
| 2011/0049726 A1* | 3/2011 | Chino | H01L 21/6835 |
| | | | 257/773 |
| 2011/0215400 A1* | 9/2011 | Nakamura | H01L 27/07 |
| | | | 257/334 |
| 2012/0098138 A1* | 4/2012 | Oka | H01L 23/49811 |
| | | | 257/773 |
| 2012/0108008 A1* | 5/2012 | Yamaji | H01L 24/11 |
| | | | 438/107 |
| 2012/0153493 A1* | 6/2012 | Lee | H01L 24/24 |
| | | | 257/774 |
| 2012/0256194 A1 | 10/2012 | Yoshihara et al. | |
| 2013/0015496 A1 | 1/2013 | Konno et al. | |
| 2013/0025914 A1* | 1/2013 | Naganuma | H05K 3/4694 |
| | | | 174/251 |
| 2014/0035658 A1* | 2/2014 | Usui | H01L 24/34 |
| | | | 327/512 |
| 2014/0120774 A1* | 5/2014 | Kim | H01L 24/49 |
| | | | 439/626 |
| 2014/0218871 A1* | 8/2014 | Kim | H01R 12/7088 |
| | | | 361/748 |
| 2016/0057881 A1* | 2/2016 | Tada | H05K 7/1432 |
| | | | 361/728 |
| 2016/0307813 A1* | 10/2016 | Tsukamoto | H01L 23/043 |
| 2017/0229428 A1* | 8/2017 | Muto | H01L 25/07 |
| 2017/0302191 A1 | 10/2017 | Nakatsu et al. | |
| 2017/0374755 A1* | 12/2017 | Chi | H01L 23/053 |
| 2018/0122723 A1* | 5/2018 | Kodaira | H01L 25/07 |
| 2019/0051640 A1 | 2/2019 | Yano et al. | |
| 2019/0139880 A1 | 5/2019 | Jakobi et al. | |

* cited by examiner

SEMICONDUCTOR DEVICE

CROSS-REFERENCE TO RELATED APPLICATION

This application is a continuation of application Ser. No. 16/269,815 filed Feb. 7, 2019 and is based upon and claims the benefit of priority from Japanese Patent Application No. 2018-173126, filed on Sep. 14, 2018, the entire contents of which are incorporated herein by reference.

FIELD

Embodiments described herein relate generally to a semiconductor device.

BACKGROUND

In power semiconductor modules, for example, a plurality of power semiconductor chips is mounted above a metal substrate with an insulating substrate interposed therebetween. The power semiconductor chip is, for example, a metal oxide field effect transistor (MOSFET), an insulated gate bipolar transistor (IGBT), or a diode. When a wiring inductance inside the power semiconductor module is large, there arises a problem that a switching loss becomes large.

DETAILED DESCRIPTION

Figure 1:
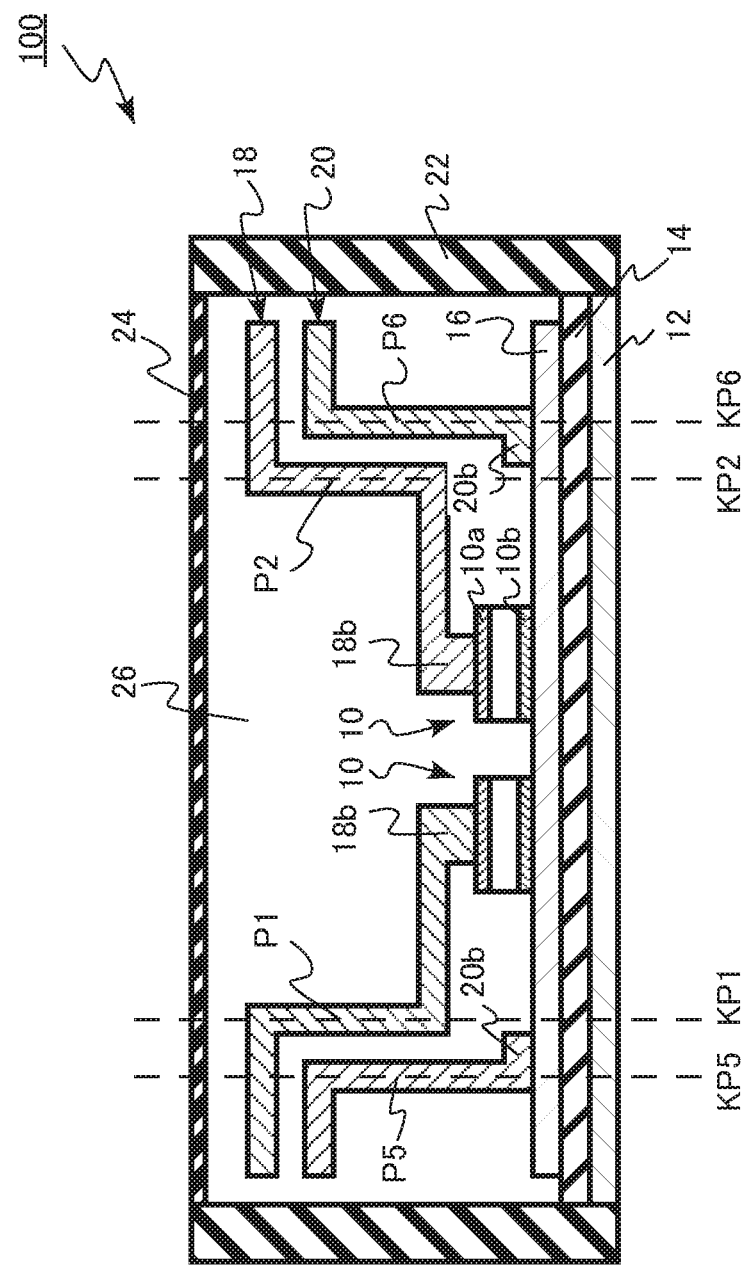
FIG. 1 is a schematic cross-sectional view of a semiconductor device of a first embodiment.

In this specification, the same or similar members will be denoted by the same reference numerals, and redundant descriptions thereof will be omitted in some cases.

In the present specification, the upward direction of the drawing will be described as "upper" and the downward direction of the drawing will be described as "lower" in some cases in order to indicate a positional relation among parts and the like. In this specification, the concepts of "upper" and "lower" are not necessarily terms indicating a relation with respect to the direction of gravity.

First Embodiment

A semiconductor device of a first embodiment includes: a substrate; a metal layer on the substrate; at least one semiconductor chip provided on the metal layer, the at least one semiconductor chip having an upper electrode and a lower electrode electrically connected to the metal layer; a first wiring board provided on the substrate, the first wiring board being electrically connected to the upper electrode, the first wiring board including a first plate-shaped portion, a second plate-shaped portion, and a third plate-shaped portion, the first plate-shaped portion, the second plate-shaped portion, and the third plate-shaped portion being perpendicular to the substrate, the first plate-shaped portion being parallel to the second plate-shaped portion, the third plate-shaped portion being perpendicular to the first plate-shaped portion and the second plate-shaped portion, and the third plate-shaped portion being connected to one end of the first plate-shaped portion and one end of the second plate-shaped portion; and a second wiring board provided on the substrate, the second wiring board being electrically connected to the metal layer, the second wiring board including a fifth plate-shaped portion, a sixth plate-shaped portion, and a seventh plate-shaped portion, the fifth plate-shaped portion, the sixth plate-shaped portion, and the seventh plate-shaped portion being perpendicular to the substrate, the fifth plate-shaped portion being parallel to the sixth plate-shaped portion, the seventh plate-shaped portion being perpendicular to the fifth plate-shaped portion and the sixth plate-shaped portion, and the seventh plate-shaped portion being connected to one end of the fifth plate-shaped portion and one end of the sixth plate-shaped portion, wherein the first plate-shaped portion and the second plate-shaped portion are provided between the fifth plate-shaped portion and the sixth plate-shaped portion, and the at least one semiconductor chip is positioned between a plane including the fifth plate-shaped portion and a plane including the sixth plate-shaped portion.

Figure 2:
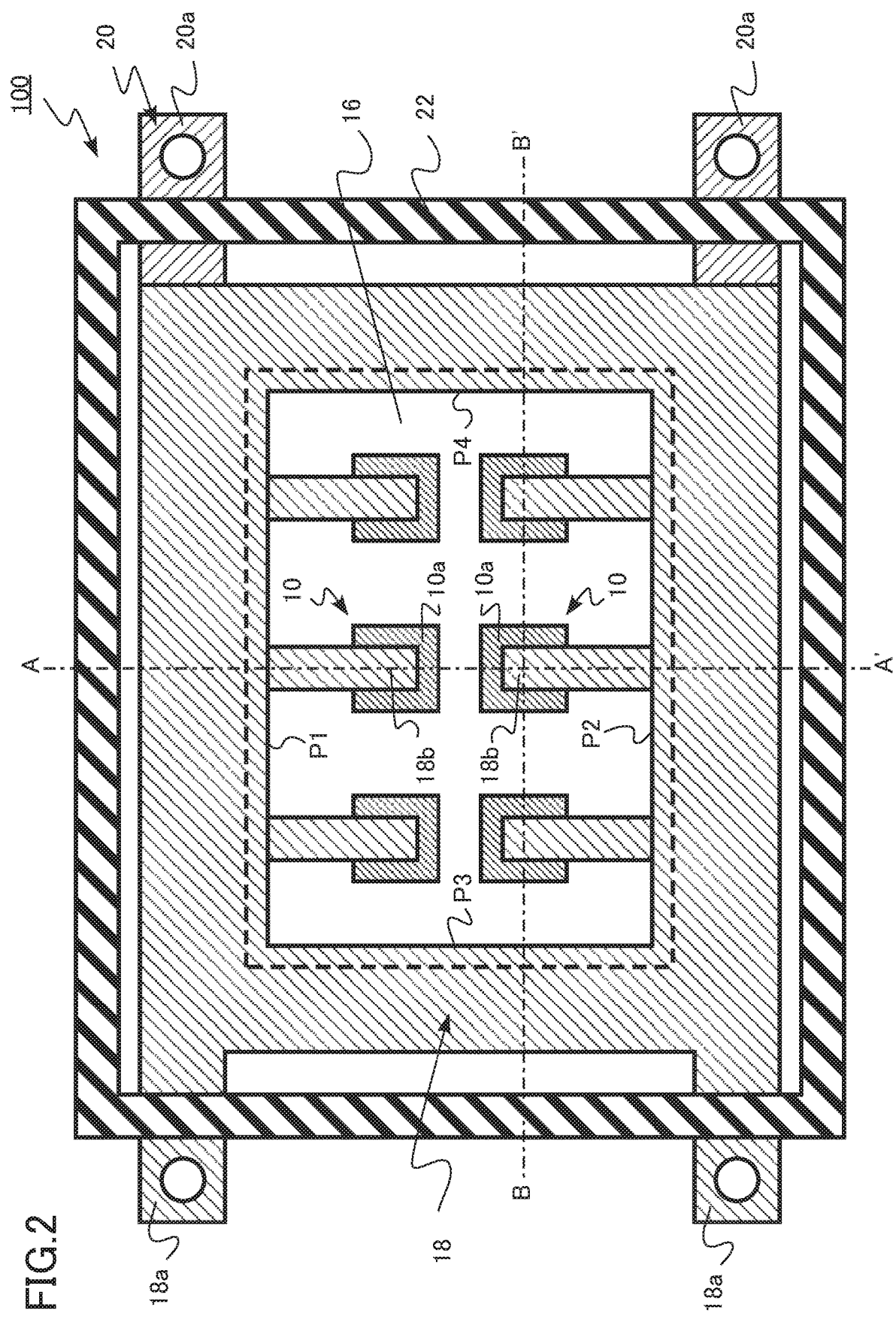
FIG. 2 is a schematic top view of the semiconductor device of the first embodiment.
Figure 3:
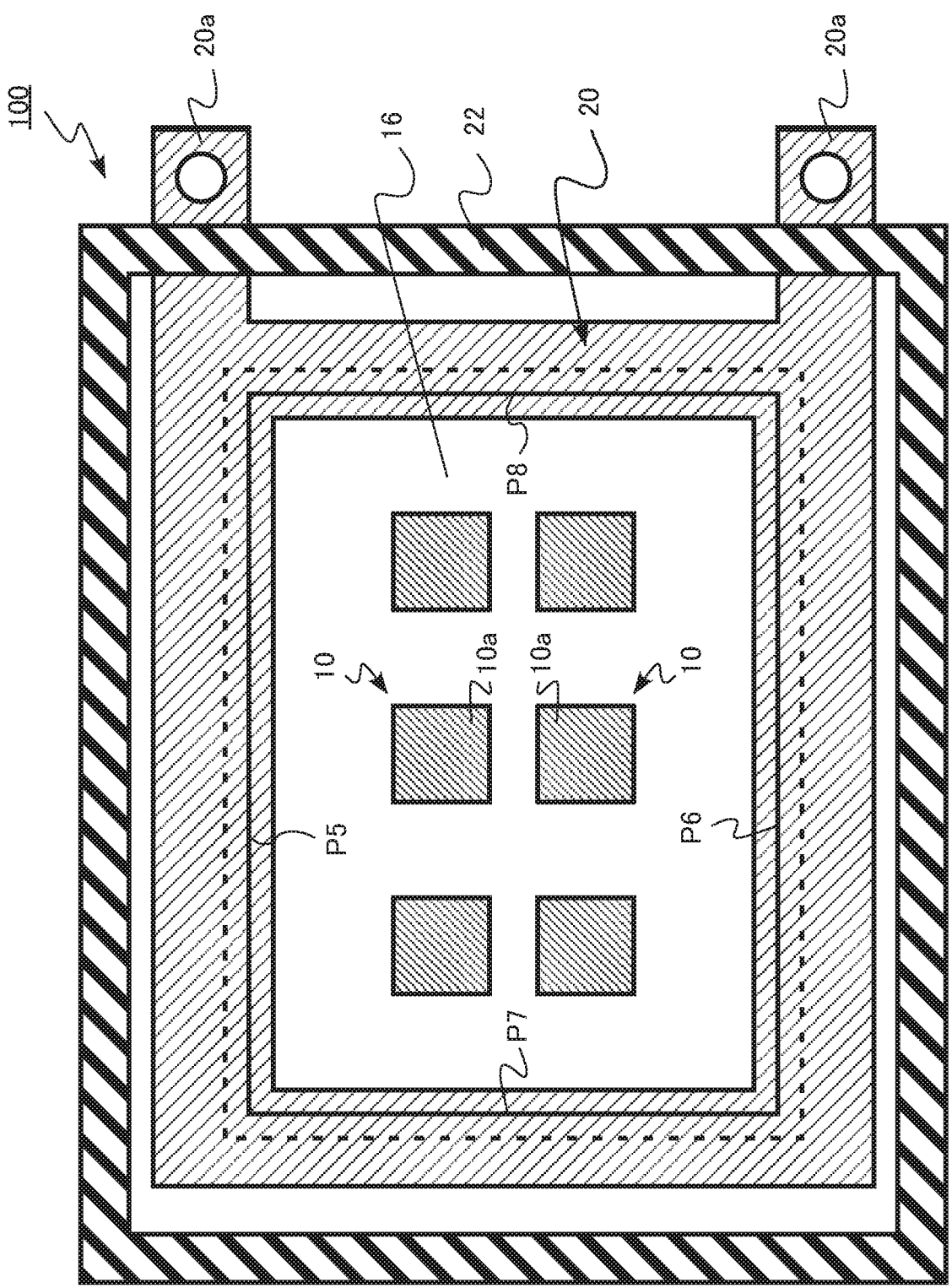
FIG. 3 is a schematic top view of the semiconductor device of the first embodiment.
Figure 4:
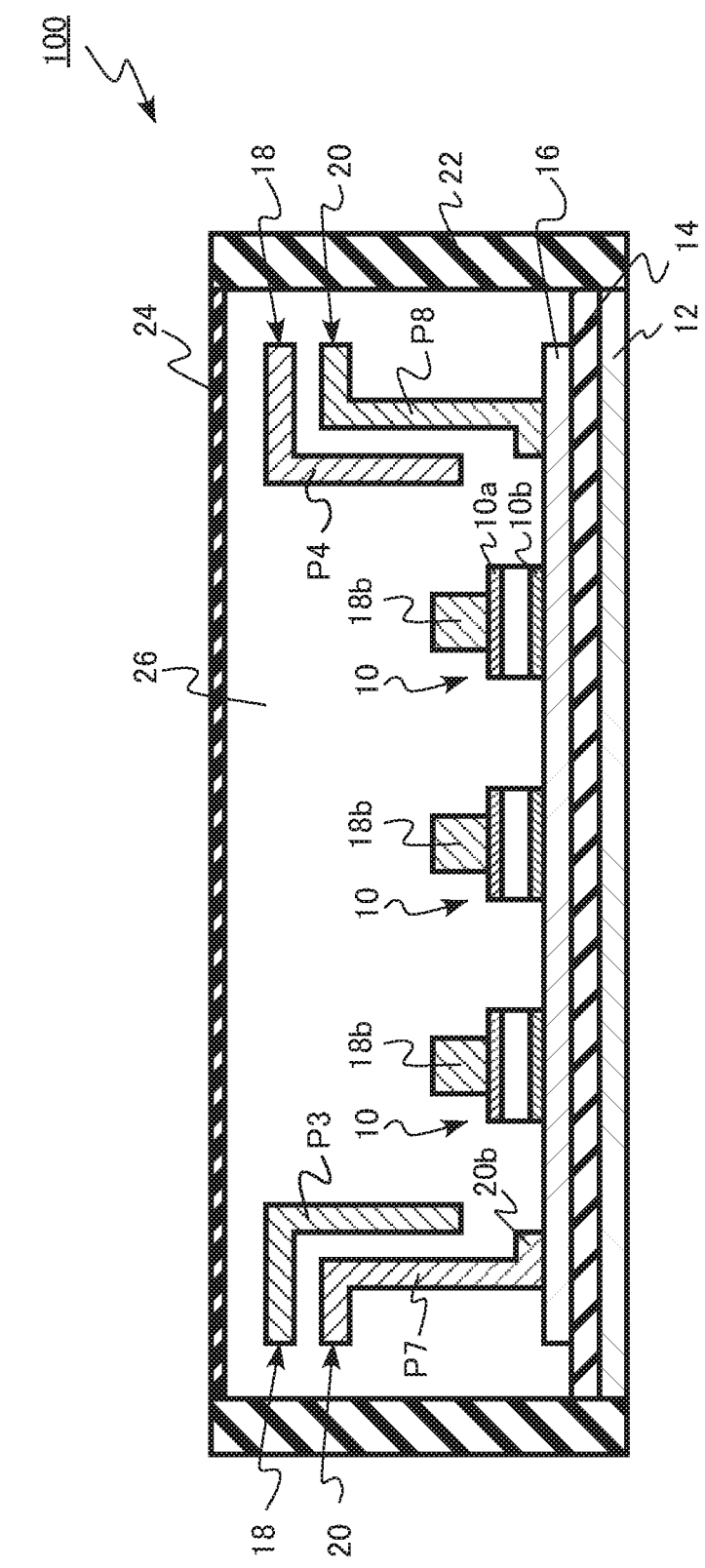
FIG. 4 is a schematic cross-sectional view of the semiconductor device of the first embodiment.

FIG. 1 is a schematic cross-sectional view of the semiconductor device of the first embodiment. FIG. 2 is a schematic top view of the semiconductor device of the first embodiment. FIG. 3 is a schematic top view of the semiconductor device of the first embodiment. FIG. 4 is a schematic cross-sectional view of the semiconductor device of the first embodiment.

The semiconductor device of the first embodiment is a power semiconductor module 100. In the power semiconductor module 100, six Schottky barrier diodes (SBD) are connected in parallel.

A power semiconductor module 100 of the first embodiment includes a plurality of semiconductor chips (SBDs) 10, a metal substrate 12, an insulating substrate 14 (substrate), a metal layer 16, an anode wiring board 18 (first wiring board), a cathode wiring board 20 (second wiring board), a resin case 22, a lid 24, and a silicone gel 26.

The SBD 10 has an anode electrode 10a (upper electrode) and a cathode electrode 10b (lower electrode).

The anode wiring board 18 has an anode external terminal 18a, a plurality of anode connecting portions 18b (connecting portions), a first plate-shaped portion P1, a second plate-shaped portion P2, a third plate-shaped portion P3, and a fourth plate-shaped portion P4. The cathode wiring board 20 has a cathode external terminal 20a, a cathode connecting portion 20b, a fifth plate-shaped portion P5, a sixth plate-shaped portion P6, a seventh plate-shaped portion P7, and an eighth plate-shaped portion P8.

FIG. 1 is a cross-sectional view taken along a line AA' of FIG. 2. FIG. 2 is a top view of the power semiconductor module 100 from which the lid 24 and the silicone gel 26 have been removed. FIG. 3 is a top view of the power semiconductor module 100 from which the lid 24, the silicone gel 26, and the anode wiring board 18 have been removed. FIG. 4 is the cross-sectional view taken along a line BB' of FIG. 2.

The metal substrate 12 is, for example, copper. For example, when the power semiconductor module 100 is mounted to a product, a heat dissipating plate (not illustrated) is connected to a back surface of the metal substrate 12.

The resin case 22 is provided around the metal substrate 12. The lid 24 is provided on the resin case 22. In addition, the inside the power semiconductor module 100 is filled with the silicone gel 26 as a sealing material. The resin case 22, the metal substrate 12, the lid 24, and the silicone gel 26 have a function of protecting or insulating members inside the power semiconductor module 100.

The insulating substrate 14 is provided in the resin case 22. The insulating substrate 14 is provided on the metal substrate 12. The insulating substrate 14 has a function of insulating the metal substrate 12 from the metal layer 16. The insulating substrate 14 contains a filler having a high thermal conductivity and made of, for example, boron nitride or the like in the resin. The insulating substrate 14 is, for example, aluminum nitride which is a high thermal conductive material.

The metal layer 16 is provided on the insulating substrate 14. The metal layer 16 is, for example, copper or aluminum.

The SBD 10 is provided on the metal layer 16. The SBD 10 is connected to the metal layer 16 using, for example, solder or Ag nanoparticles. The SBD 10 has the anode electrode 10a on a top surface and a cathode electrode 10b on a bottom surface.

The SBD 10 is a semiconductor chip using, for example, silicon carbide (SiC), silicon (Si), gallium nitride (GaN), or the like.

The anode wiring board 18 is provided on the insulating substrate 14. The anode wiring board 18 has the anode external terminal 18a. The anode external terminal 18a is provided outside the resin case 22.

The anode wiring board 18 has the first plate-shaped portion P1, the second plate-shaped portion P2, the third plate-shaped portion P3, and the fourth plate-shaped portion P4. The first plate-shaped portion P1, the second plate-shaped portion P2, the third plate-shaped portion P3, and the fourth plate-shaped portion P4 are perpendicular to the insulating substrate 14.

The first plate-shaped portion P1 faces the second plate-shaped portion P2. The first plate-shaped portion P1 is parallel to the second plate-shaped portion P2.

The third plate-shaped portion P3 faces the fourth plate-shaped portion P4. The third plate-shaped portion P3 is parallel to the fourth plate-shaped portion P4. The third plate-shaped portion P3 and the fourth plate-shaped portion P4 are perpendicular to the first plate-shaped portion P1 and the second plate-shaped portion P2.

The third plate-shaped portion P3 is connected to one end of the first plate-shaped portion P1 and one end of the second plate-shaped portion P2. The fourth plate-shaped portion P4 is connected to the other end of the first plate-shaped portion P1 and the other end of the second plate-shaped portion P2.

The first plate-shaped portion P1, the second plate-shaped portion P2, the third plate-shaped portion P3, and the fourth plate-shaped portion P4 form a frame shape.

The anode wiring board 18 has the plurality of anode connecting portions 18b. The anode connecting portion 18b and the anode electrode 10a are connected. The anode connecting portion 18b and the anode electrode 10a are connected by, for example, solder. Further, for example, the anode connecting portion 18b and the anode electrode 10a are connected by ultrasonic welding.

The cathode wiring board 20 is provided on the insulating substrate 14. The cathode wiring board 20 has the cathode external terminal 20a. The cathode external terminal 20a is provided outside the resin case 22.

The cathode wiring board 20 has the fifth plate-shaped portion P5, the sixth plate-shaped portion P6, the seventh plate-shaped portion P7, and the eighth plate-shaped portion P8. The fifth plate-shaped portion P5, the sixth plate-shaped portion P6, the seventh plate-shaped portion P7, and the eighth plate-shaped portion P8 are perpendicular to the insulating substrate 14.

The fifth plate-shaped portion P5 faces the sixth plate-shaped portion P6. The fifth plate-shaped portion P5 is parallel to the sixth plate-shaped portion P6.

The seventh plate-shaped portion P7 faces the eighth plate-shaped portion P8. The seventh plate-shaped portion P7 is parallel to the eighth plate-shaped portion P8. The seventh plate-shaped portion P7 and the eighth plate-shaped portion P8 are perpendicular to the fifth plate-shaped portion P5 and the sixth plate-shaped portion P6.

The seventh plate-shaped portion P7 is connected to one end of the fifth plate-shaped portion P5 and one end of the sixth plate-shaped portion P6. The eighth plate-shaped portion P8 is connected to the other end of the fifth plate-shaped portion P5 and the other end of the sixth plate-shaped portion P6.

The fifth plate-shaped portion P5, the sixth plate-shaped portion P6, the seventh plate-shaped portion P7, and the eighth plate-shaped portion P8 form a frame shape.

The first plate-shaped portion P1, the second plate-shaped portion P2, the third plate-shaped portion P3, and the fourth plate-shaped portion P4 are positioned at the inner side of the fifth plate-shaped portion P5, the sixth plate-shaped portion P6, the seventh plate-shaped portion P7, and the eighth plate-shaped portion P8. The first plate-shaped portion P1 and the second plate-shaped portion P2 are positioned between the fifth plate-shaped portion P5 and the sixth plate-shaped portion P6. The third plate-shaped portion P3 and the fourth plate-shaped portion P4 are positioned between the seventh plate-shaped portion P7 and the eighth plate-shaped portion P8.

The SBD 10 is positioned at the inner side of the frame shape formed by the fifth plate-shaped portion P5, the sixth plate-shaped portion P6, the seventh plate-shaped portion P7, and the eighth plate-shaped portion P8. For example, the SBD 10 is positioned between a virtual plane (KP5 in FIG. 1) including the fifth plate-shaped portion P5 and a virtual plane (KP6 in FIG. 1) including the sixth plate-shaped portion P6.

In addition, the SBD 10 is positioned at the inner side of the frame shape formed by the first plate-shaped portion P1, the second plate-shaped portion P2, the third plate-shaped portion P3, and the fourth plate-shaped portion P4. For example, the SBD 10 is positioned between a virtual plane (KP1 in FIG. 1) including the first plate-shaped portion P1 and a virtual plane (KP2 in FIG. 1) including the second plate-shaped portion P2.

A distance between the first plate-shaped portion P1 and the fifth plate-shaped portion P5 is, for example, 2 mm or smaller. A distance between the second plate-shaped portion P2 and the sixth plate-shaped portion P6 is, for example, 2 mm or smaller.

Next, a function and an effect of the semiconductor device of the first embodiment will be described.

If a wiring inductance inside the power semiconductor module is large, a surge voltage or ringing of a voltage waveform occurs at the time of performing a switching operation of a semiconductor chip at high speed. The surge voltage or ringing of the voltage waveform leads to device destruction or an increase of electromagnetic interference (EMI) noise, which is problematic. If the switching operation is performed at a low speed, the surge voltage or ringing of the voltage waveform can be suppressed, but there arises a problem that a switching loss becomes large. Therefore, it is desired to reduce the internal inductance of the power semiconductor module.

Figure 5:
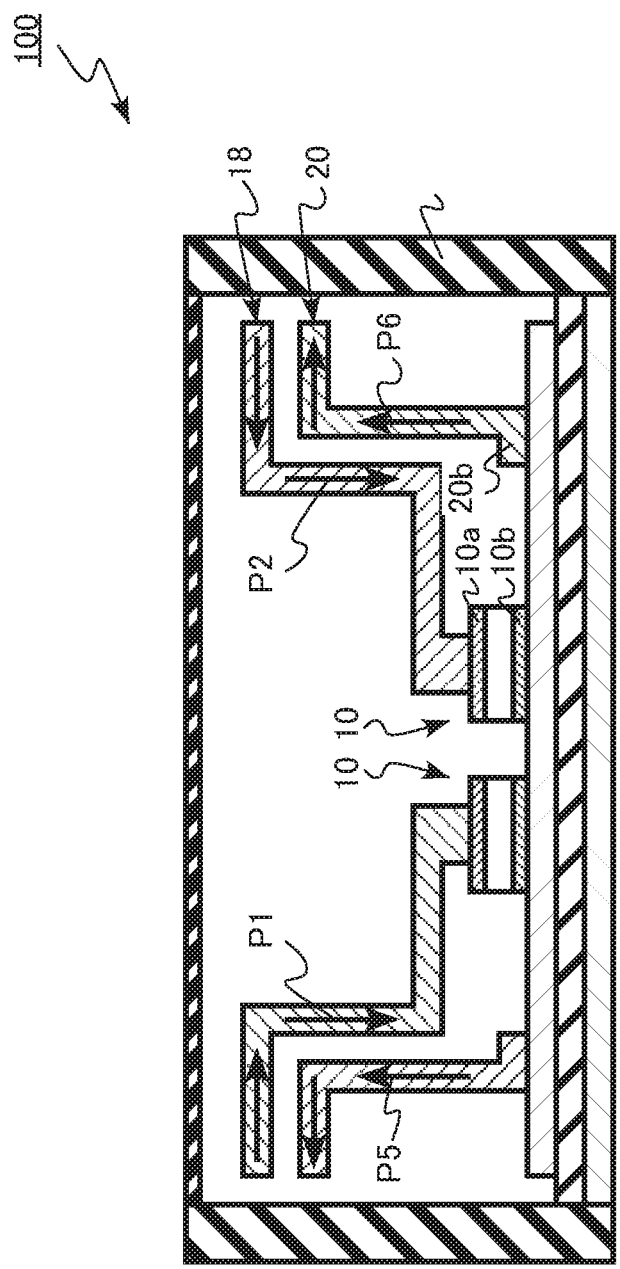
FIG. 5 is an explanatory view of a function and an effect of the semiconductor device of the first embodiment.

FIG. 5 is an explanatory diagram of the function and the effect of the semiconductor device of the first embodiment. FIG. 5 is a cross-sectional view corresponding to FIG. 1. In FIG. 5, directions of currents flowing through the anode wiring board 18 and the cathode wiring board 20 are indicated by arrows.

Wiring inductances include a self-inductance due to self-induction and a mutual inductance due to mutual induction. The inductance of the wiring is the sum of the self-inductance and the mutual inductance. For example, an inductance of the anode wiring board 18 and the cathode wiring board 20 is the sum of a self-inductance of each of the anode wiring board 18 and the cathode wiring board 20 and a mutual inductance caused by mutual induction between the anode wiring board 18 and the cathode wiring board 20.

In the power semiconductor module 100, the majority of the anode wiring board 18 and the cathode wiring board 20 are parallel flat plates, and flowing directions of currents are opposite in the parallel flat plate parts. Therefore, the mutual inductance functions in a direction to cancel the self-inductance. Therefore, the inductance of the anode wiring board 18 and the cathode wiring board 20 is reduced. Therefore, the inductance inside the power semiconductor module 100 is reduced.

In the power semiconductor module 100, the anode wiring board 18 and the cathode wiring board 20 are provided so as to surround the plurality of SBDs 10. Therefore, an electric resistance of a current path of each of the SBDs 10 becomes small. In addition, variations in the electric resistance of the current path of the SBD 10 are reduced. Therefore, for example, current variations between the plurality of SBDs 10 are reduced. Therefore, for example, destruction of the device caused by current concentration on the specific SBD 10 is suppressed, and the reliability of the power semiconductor module 100 is improved.

From the viewpoint of reducing the internal inductance, the distance between the first plate-shaped portion P1 and the fifth plate-shaped portion P5 and the distance between the second plate-shaped portion P2 and the sixth plate-shaped portion P6 are preferably 2 mm or smaller, more preferably 1 mm or smaller, and still more preferably 0.5 mm or smaller.

As described above, it is possible to realize the power semiconductor module with the reduced internal inductance and the small switching loss according to the first embodiment. In addition, the variations in current between devices are suppressed, and the power semiconductor module with improved reliability can be realized.

Second Embodiment

A semiconductor device of a second embodiment is different from that of the first embodiment in that a dielectric layer is provided between the first plate-shaped portion and the fifth plate-shaped portion and between the second plate-shaped portion and the sixth plate-shaped portion. Hereinafter, the content overlapping with that in the first embodiment may not be described.

Figure 6:
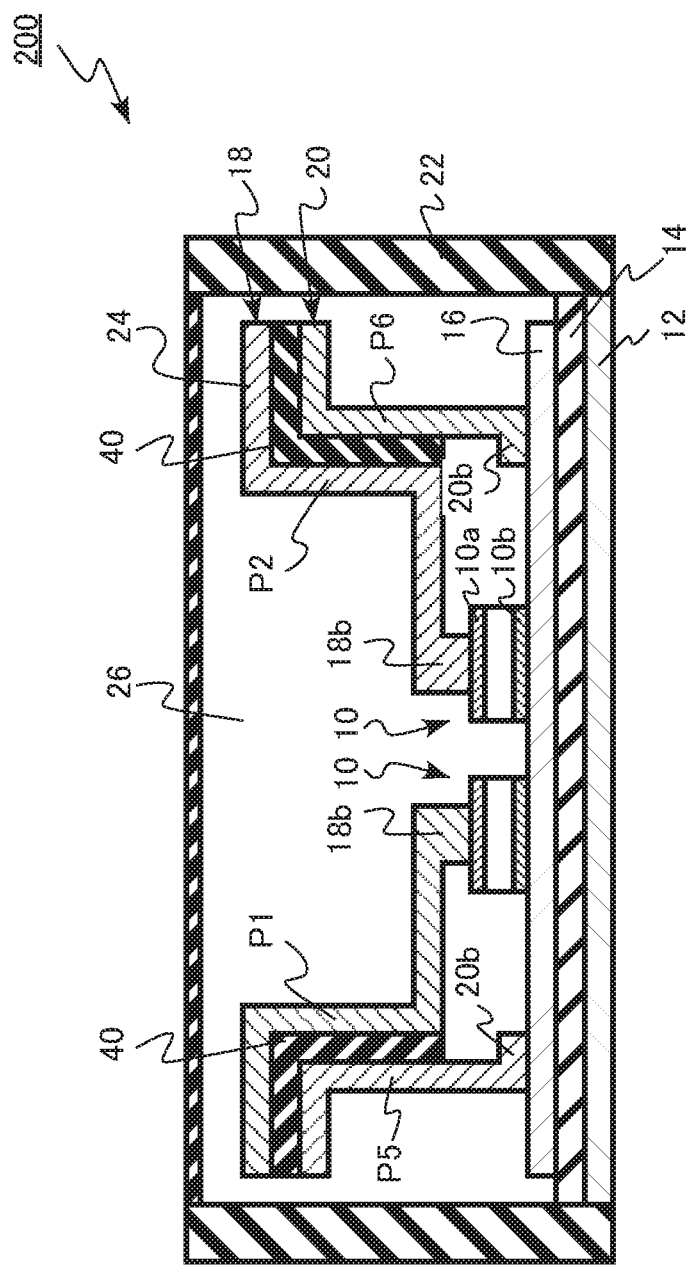
FIG. 6 is a schematic cross-sectional view of a semiconductor device of a second embodiment.

FIG. 6 is a schematic cross-sectional view of the semiconductor device of the second embodiment. FIG. 6 is a view corresponding to FIG. 1 of the first embodiment.

The semiconductor device of the second embodiment is a power semiconductor module 200. In the power semiconductor module 200, six Schottky barrier diodes (SBD) are connected in parallel.

In the power semiconductor module 200, a dielectric layer 40 is provided between the first plate-shaped portion P1 and the fifth plate-shaped portion P5. The dielectric layer 40 is a dielectric material having high insulation performance. The dielectric layer 40 is provided between the second plate-shaped portion P2 and the sixth plate-shaped portion P6. Similarly, the dielectric layer 40 is also provided between the third plate-shaped portion P3 and the seventh plate-shaped portion P7, and between the fourth plate-shaped portion P4 and the eighth plate-shaped portion P8.

The dielectric layer 40 is, for example, an epoxy resin. Alternatively, the dielectric layer 40 is, for example, a polyimide resin.

It is possible to easily manufacture a structure in which a distance between the plate-shaped portion of the anode wiring board 18 and the plate-shaped portion of the cathode wiring board 20 is small by providing the dielectric layer 40. Therefore, it is easy to reduce the internal inductance.

As described above, it is possible to realize the power semiconductor module with a reduced internal inductance and a small switching loss according to the second embodiment, which is similar to the first embodiment. In addition, the variations in current between devices are suppressed, and the power semiconductor module with improved reliability can be realized. Further, it becomes easy to reduce the internal inductance.

Third Embodiment

A semiconductor device of a third embodiment is different from that of the first embodiment in that the first wiring board does not have the fourth plate-shaped portion and the second wiring board does not have the eighth plate-shaped portion. Hereinafter, the content overlapping with that in the first embodiment may not be described.

Figure 7:
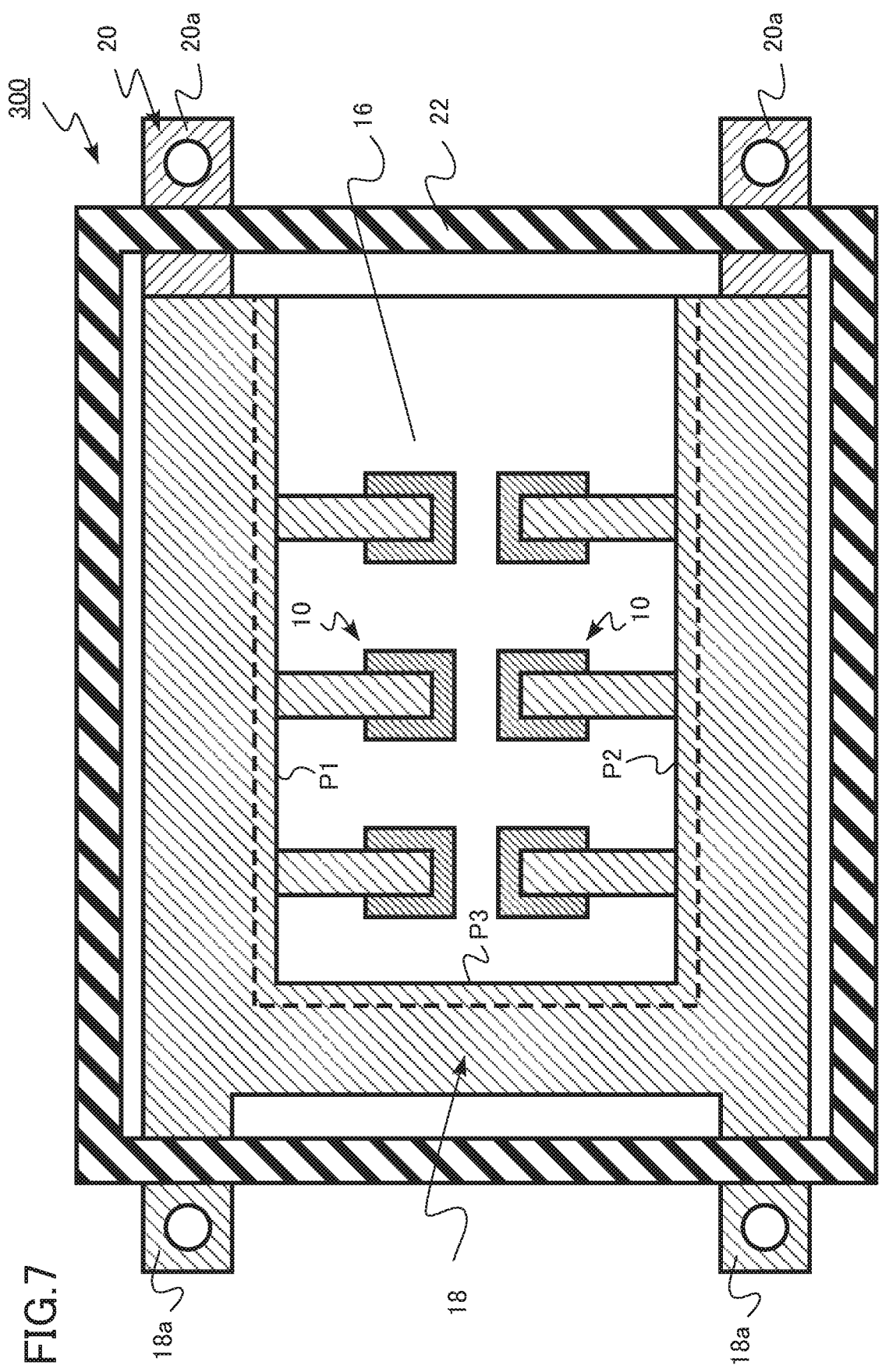
FIG. 7 is a schematic top view of a semiconductor device of a third embodiment.

FIG. 7 is a schematic top view of the semiconductor device of the third embodiment. FIG. 7 is a view corresponding to FIG. 2 of the first embodiment.

Figure 8:
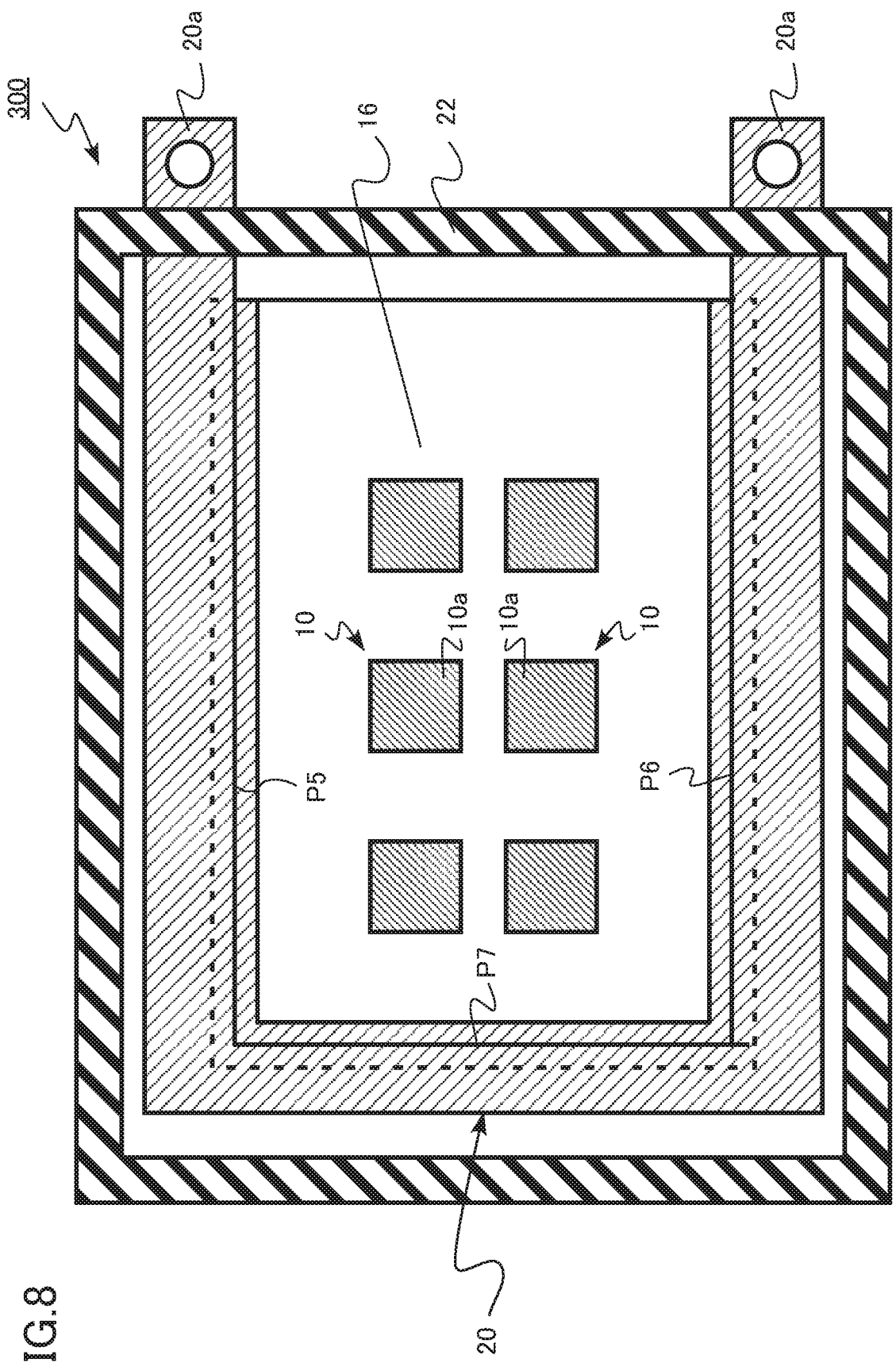
FIG. 8 is a schematic top view of the semiconductor device of the third embodiment.

FIG. 8 is a schematic top view of the semiconductor device of the third embodiment. FIG. 8 is a view corresponding to FIG. 3 of the first embodiment.

Figure 9:
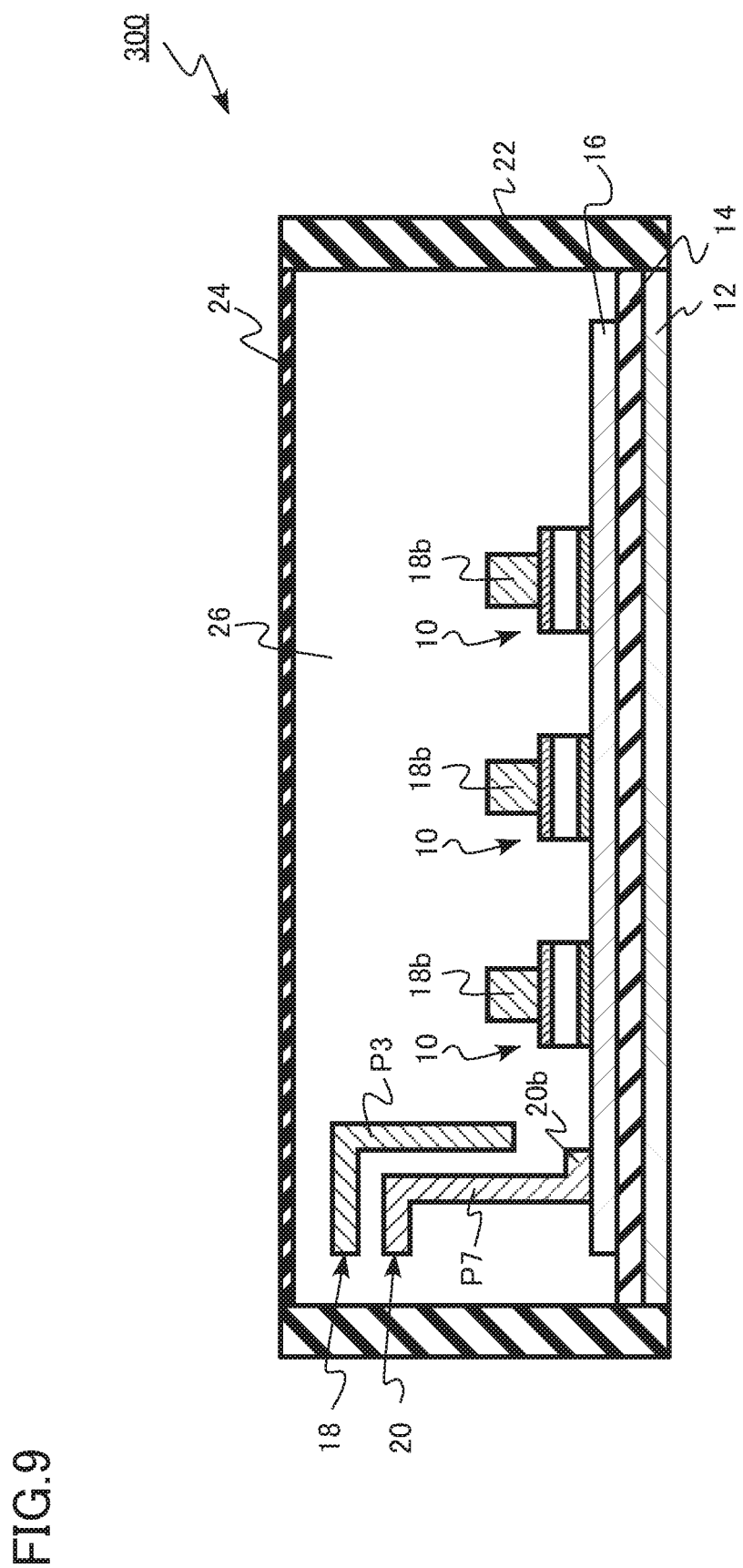
FIG. 9 is a schematic cross-sectional view of the semiconductor device of the third embodiment.

FIG. 9 is a schematic cross-sectional view of the semiconductor device of the third embodiment. FIG. 9 is a view corresponding to FIG. 4 of the first embodiment.

The semiconductor device of the third embodiment is a power semiconductor module 300. In the power semiconductor module 300, six Schottky barrier diodes (SBD) are connected in parallel.

In the power semiconductor module 300, the anode wiring board 18 has the first plate-shaped portion P1, the second plate-shaped portion P2, and the third plate-shaped portion P3, but does not have the fourth plate-shaped portion P4. Further, the cathode wiring board 20 has the fifth plate-shaped portion P5, the sixth plate-shaped portion P6, and the seventh plate-shaped portion P7, but does not have the eighth plate-shaped portion P8.

According to the power semiconductor module 300, it is possible to adjust an internal inductance, for example, by not providing the fourth plate-shaped portion P4 and the eighth plate-shaped portion P8. Further, it is possible to provide a new semiconductor chip or wiring.

As described above, it is possible to realize the power semiconductor module with a reduced internal inductance and a small switching loss according to the third embodiment, which is similar to the first embodiment. In addition, the variations in current between devices are suppressed, and the power semiconductor module with improved reliability can be realized. Further, it is possible to adjust the internal inductance and provide a new semiconductor chip or wiring.

Fourth Embodiment

A semiconductor device of a fourth embodiment is different from that of the first embodiment in that a slit is provided in at least one of the first wiring board and the second wiring board. Hereinafter, the content overlapping with that in the first embodiment may not be described.

Figure 10:
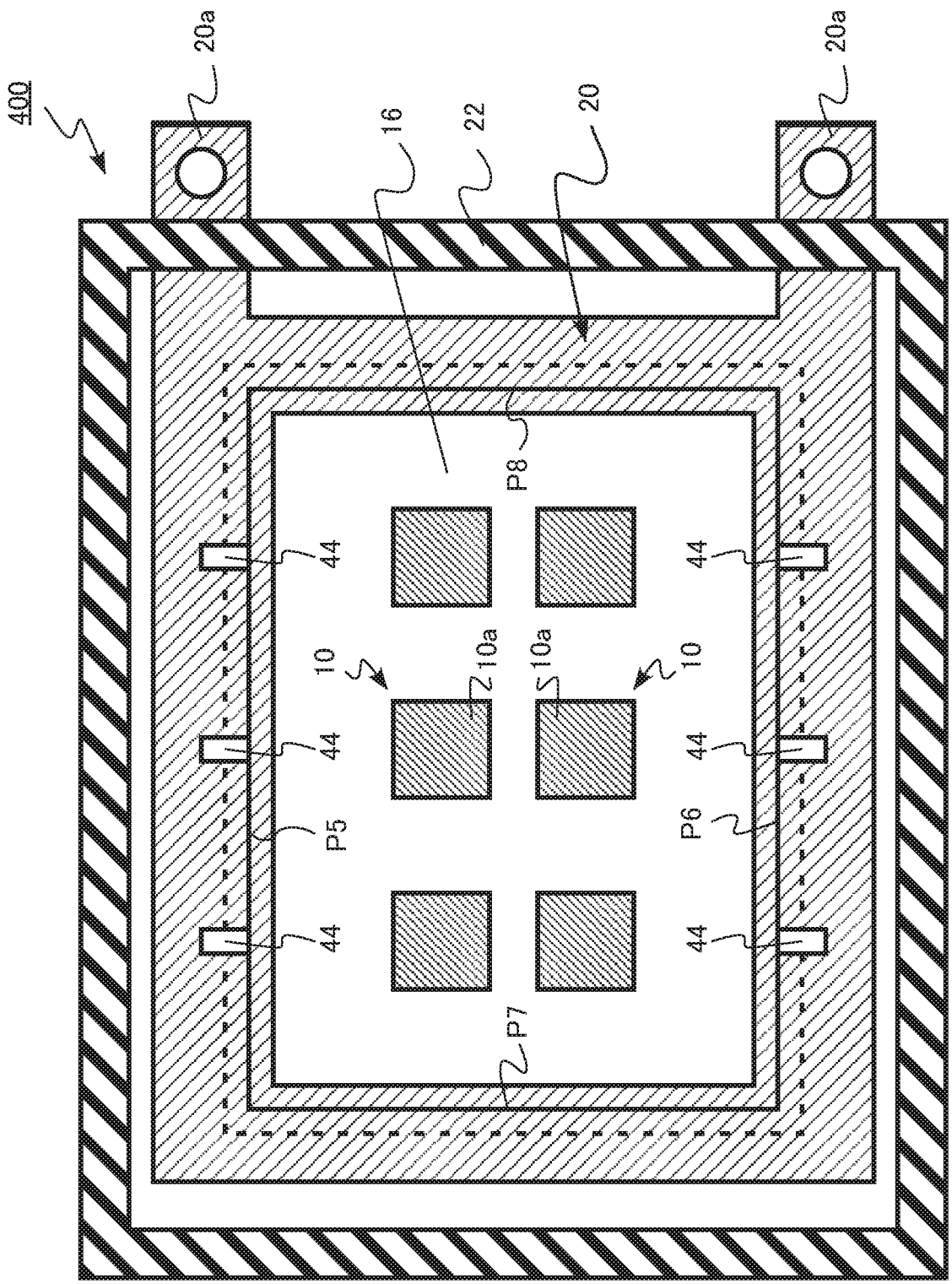
FIG. 10 is a schematic top view of a semiconductor device of a fourth embodiment.

FIG. 10 is a schematic top view of the semiconductor device of the fourth embodiment. FIG. 10 is a view corresponding to FIG. 3 of the first embodiment.

Figure 11:
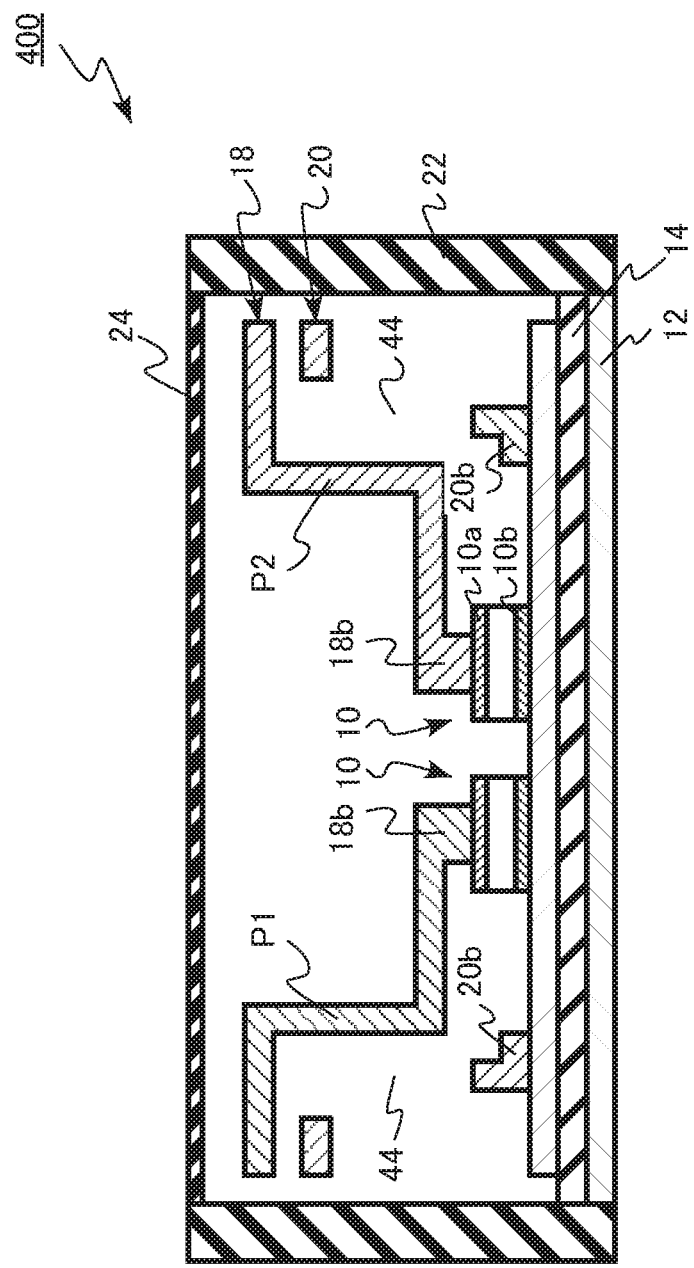
FIG. 11 is a schematic cross-sectional view of the semiconductor device of the fourth embodiment.

FIG. 11 is a schematic cross-sectional view of the semiconductor device of the fourth embodiment. FIG. 11 is a view corresponding to FIG. 1 of the first embodiment.

The semiconductor device of the fourth embodiment is a power semiconductor module 400. In the power semiconductor module 400, six Schottky barrier diodes (SBD) are connected in parallel.

In the power semiconductor module 400, for example, a slit 44 is provided in the cathode wiring board 20. The slit may be provided in the anode wiring board 18.

In the power semiconductor module 400, it is possible to adjust an internal inductance by providing the slit in at least one of the anode wiring board 18 and the cathode wiring board 20.

As described above, it is possible to realize the power semiconductor module with a reduced internal inductance and a small switching loss according to the fourth embodiment, which is similar to the first embodiment. In addition, the variations in current between devices are suppressed, and the power semiconductor module with improved reliability can be realized. Further, it is possible to adjust the internal inductance and provide a new semiconductor chip or wiring.

Fifth Embodiment

A semiconductor device of a fifth embodiment is different from that of the first embodiment in that a first wiring board and an upper electrode are electrically connected to each other with a bonding wire interposed therebetween. Hereinafter, the content overlapping with that in the first embodiment may not be described.

Figure 12:
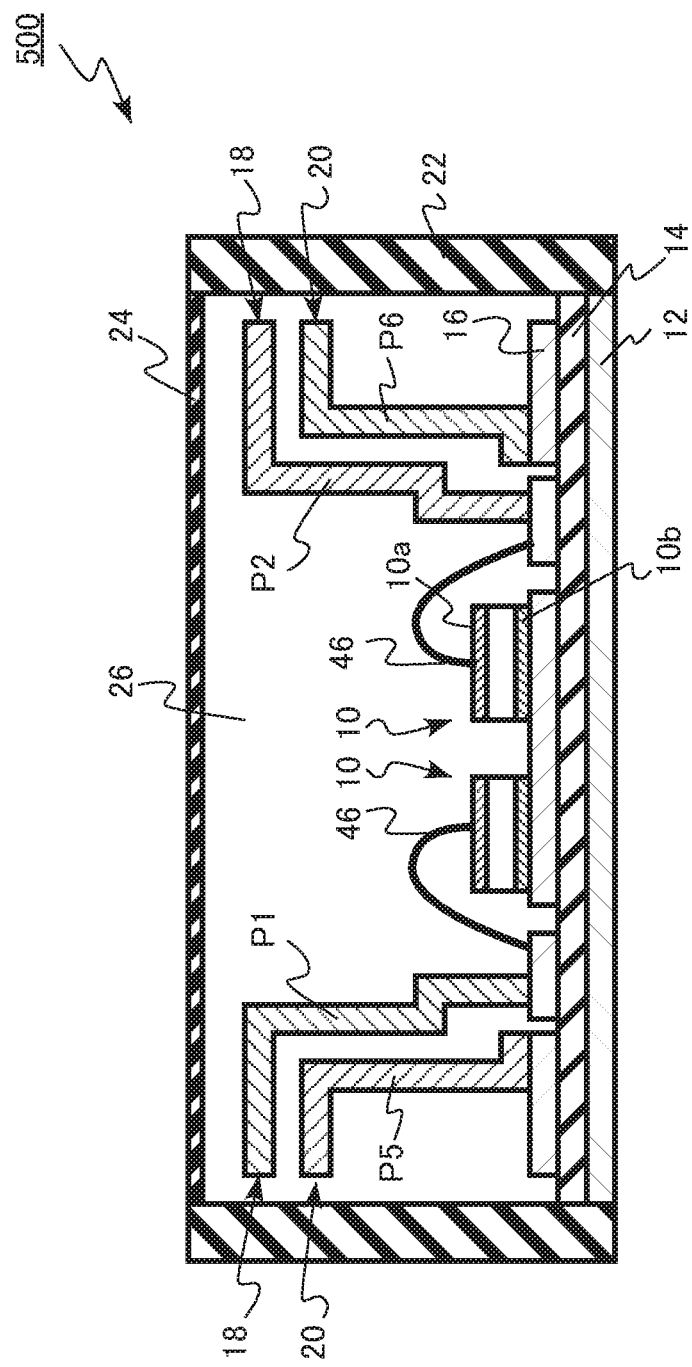
FIG. 12 is a schematic cross-sectional view of a semiconductor device of a fifth embodiment.

FIG. 12 is a schematic cross-sectional view of the semiconductor device of the fifth embodiment. FIG. 12 is a view corresponding to FIG. 1 of the first embodiment.

The semiconductor device of the fifth embodiment is a power semiconductor module 500. In the power semiconductor module 500, six Schottky barrier diodes (SBD) are connected in parallel.

The power semiconductor module 500 has a bonding wire 46. The anode wiring board 18 and the anode electrode 10a of the SBD 10 are electrically connected with the bonding wire 46 interposed therebetween.

The stress applied to the SBD 10 is reduced by using the bonding wire 46. Therefore, the reliability of the power semiconductor module 500 is improved.

As described above, it is possible to realize the power semiconductor module with a reduced internal inductance and a small switching loss according to the fifth embodiment, which is similar to the first embodiment. In addition, the variations in current between devices are suppressed, and the power semiconductor module with improved reliability can be realized. Since it is possible to mitigate the stress acting directly from the wiring board to the semiconductor chip, the reliability of the power semiconductor module is improved.

Sixth Embodiment

A semiconductor device of a sixth embodiment is different from that of the first embodiment in that a first wiring board and a second wiring board do not have external terminals. Hereinafter, the content overlapping with that in the first embodiment may not be described.

Figure 13:
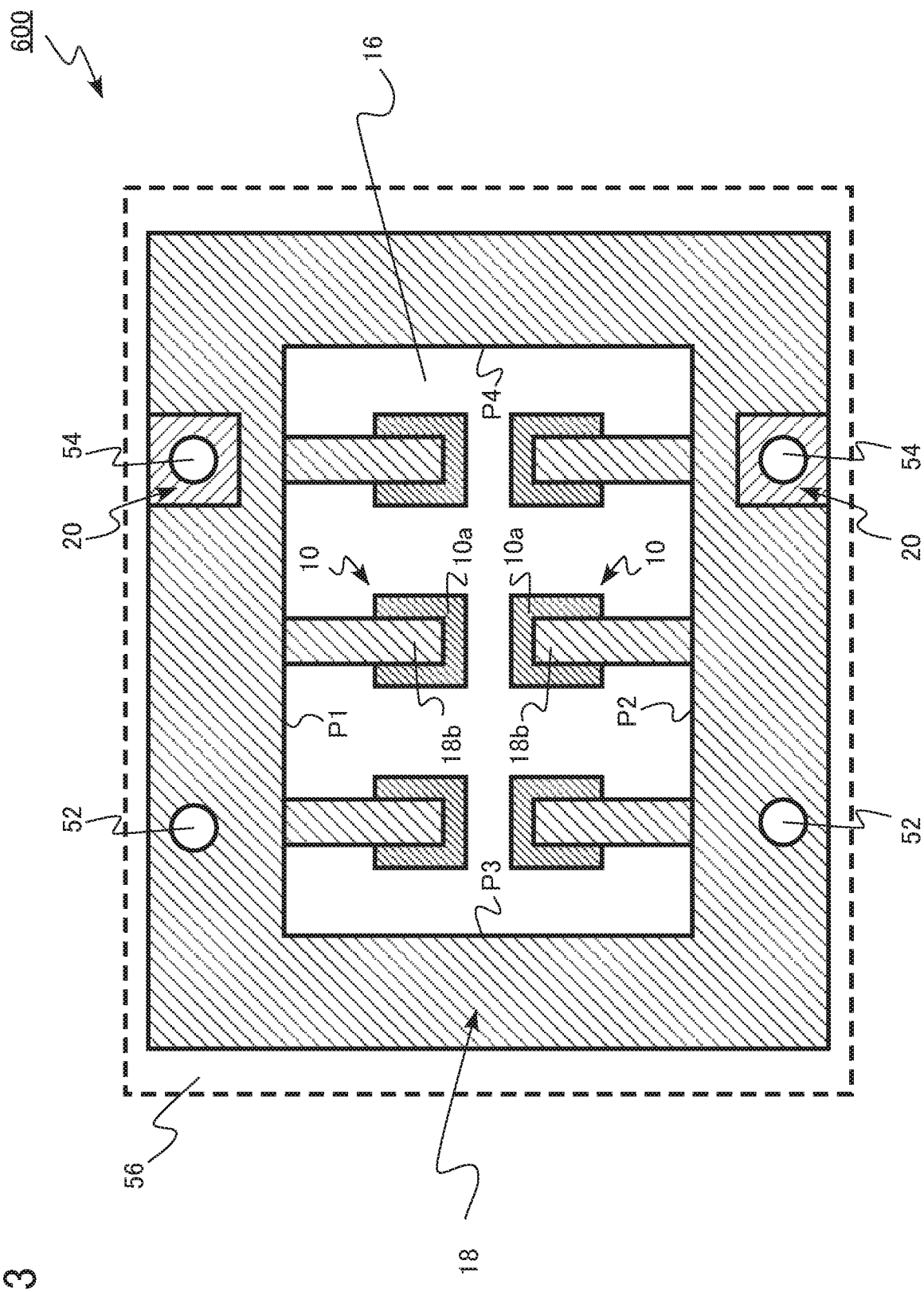
FIG. 13 is a schematic top view of a semiconductor device of a sixth embodiment.

FIG. 13 is a schematic top view of the semiconductor device of the sixth embodiment. FIG. 13 is a view corresponding to FIG. 2 of the first embodiment.

The semiconductor device of the sixth embodiment is a power semiconductor module 600. In the power semiconductor module 600, six Schottky barrier diodes (SBD) are connected in parallel.

The power semiconductor module 600 includes an anode connection screw fixing portion 52 and a cathode connection screw fixing portion 54. The power semiconductor module 600 is covered with, for example, a mold resin 56, and the anode connection screw fixing portion 52 and the cathode connection screw fixing portion 54 are exposed on a surface of the mold resin 56.

According to the power semiconductor module 600, the low-inductance power semiconductor module circuit can be realized, for example, by connecting a laminated wiring structure bus bar having a low inductance to the anode connection screw fixing portion 52 and the cathode connection screw fixing portion 54.

Seventh Embodiment

A semiconductor device of a seventh embodiment is different from that of the first embodiment in that the number of semiconductor chips to be mounted is different. Hereinafter, the content overlapping with that in the first embodiment may not be described.

Figure 14:
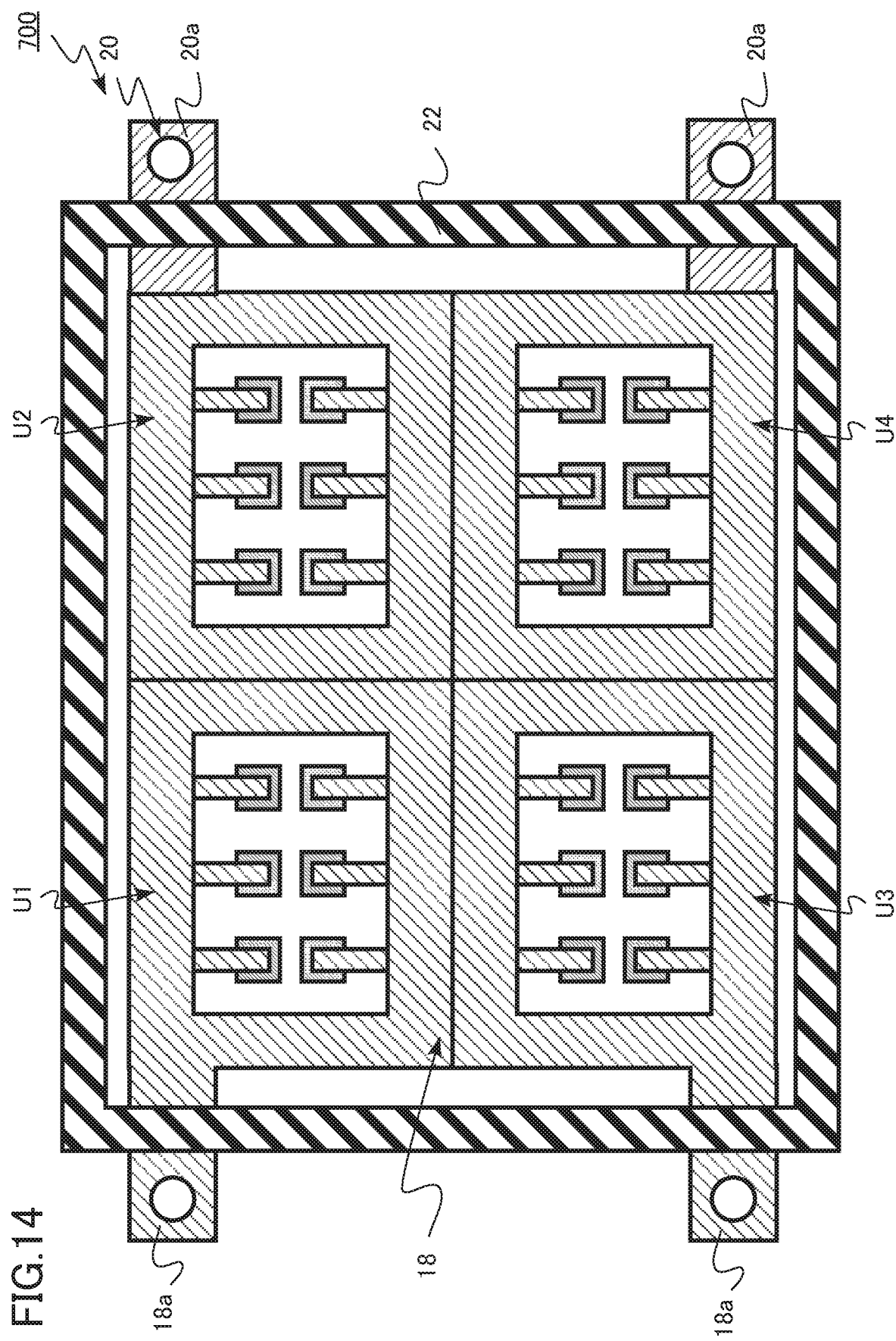
FIG. 14 is a schematic top view of a semiconductor device of a seventh embodiment.

FIG. 14 is a schematic top view of the semiconductor device of the seventh embodiment.

The semiconductor device of the seventh embodiment is a power semiconductor module 700. In the power semiconductor module 700, 24 Schottky barrier diodes (SBD) are connected in parallel.

The power semiconductor module 700 has four units U1, U2, U3, and U4. Each unit has the same configuration as the power semiconductor module 100 of the first embodiment and has six SBDs.

As described above, it is possible to realize the power semiconductor module with a reduced internal inductance and a small switching loss according to the seventh embodiment, which is similar to the first embodiment. In addition, the variations in current between devices are suppressed, and the power semiconductor module with improved reliability can be realized. Further, a large current can flow as the number of semiconductor chips increases.

Although the case where six or twenty-four semiconductor chips are mounted has been described as an example in the first to seventh embodiments, the number of semiconductor chips is not limited to six or twenty-four.

Although the case of using the SBD as the semiconductor chip has been described as an example in the first to seventh embodiments, the semiconductor chip is not limited thereto. For example, other transistors and diodes such as MOSFET, IGBT, and PIN diode can be applied. It is also possible to apply a combination of a transistor and a diode.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a substrate;
   a metal layer on the substrate;
   at least one semiconductor chip provided on the metal layer, the at least one semiconductor chip having an upper electrode and a lower electrode electrically connected to the metal layer;
   a first wiring board provided on the substrate, the first wiring board being electrically connected to the upper electrode, the first wiring board including a first plate-shaped portion, a second plate-shaped portion, and a third plate-shaped portion, the first plate-shaped portion facing the second plate-shaped portion, and the third plate-shaped portion being connected to one end of the first plate-shaped portion and one end of the second plate-shaped portion; and
   a second wiring board provided on the substrate, the second wiring board being electrically connected to the metal layer, the second wiring board including a fifth plate-shaped portion, a sixth plate-shaped portion, and a seventh plate-shaped portion, the fifth plate-shaped portion facing the sixth plate-shaped portion, and the seventh plate-shaped portion being connected to one end of the fifth plate-shaped portion and one end of the sixth plate-shaped portion,
   wherein the first plate-shaped portion and the second plate-shaped portion are provided between the fifth plate-shaped portion and the sixth plate-shaped portion, and
   the at least one semiconductor chip is positioned between a plane including the fifth plate-shaped portion and a plane including the sixth plate-shaped portion.

2. The semiconductor device according to claim 1, wherein
   the first wiring board has a fourth plate-shaped portion, the fourth plate-shaped portion faces the third plate-shaped portion, the fourth plate-shaped portion is connected to the other end of the first plate-shaped portion and the other end of the second plate-shaped portion,
   the second wiring board has an eighth plate-shaped portion, the eighth plate-shaped portion faces the seventh plate-shaped portion, and the eighth plate-shaped portion is connected to the other end of the fifth plate-shaped portion and the other end of the sixth plate-shaped portion.

3. The semiconductor device according to claim 1, wherein
   the at least one semiconductor chip is a plurality of semiconductor chips,
   the first wiring board has a plurality of connecting portions, and
   each of the upper electrode of the plurality of semiconductor chips and each of the connection portions are connected to each other.

4. The semiconductor device according to claim 1, wherein the first wiring board and the upper electrode are electrically connected to each other with a bonding wire interposed between the first wiring board and the upper electrode.

5. The semiconductor device according to claim 1, wherein a slit is provided in at least one of the first wiring board and the second wiring board.

6. The semiconductor device according to claim 1, wherein a dielectric layer is provided between the first plate-shaped portion and the fifth plate-shaped portion and between the second plate-shaped portion and the sixth plate-shaped portion.

7. The semiconductor device according to claim 1, wherein a distance between the first plate-shaped portion and the fifth plate-shaped portion and a distance between the second plate-shaped portion and the sixth plate-shaped portion are 2 mm or smaller.

8. The semiconductor device according to claim 1, further comprising a resin case, wherein the substrate, the at least one semiconductor chip, the first wiring board, and the second wiring board are provided in the resin case.

9. The semiconductor device according to claim 1, wherein the at least one semiconductor chip is positioned between a plane including the first plate-shaped portion and a plane including the second plate-shaped portion.

10. The semiconductor device according to claim 2, wherein the at least one semiconductor chip is positioned between a plane including the seventh plate-shaped portion and a plane including the eighth plate-shaped portion.

* * * * *